United States Patent
Oishi et al.

(10) Patent No.: US 11,605,716 B2
(45) Date of Patent: Mar. 14, 2023

(54) NITRIDE SEMICONDUCTOR SUBSTRATE AND METHOD OF MANUFACTURING THE SAME

(71) Applicant: CoorsTek KK, Tokyo (JP)

(72) Inventors: Hiroshi Oishi, Hadano (JP); Jun Komiyama, Hadano (JP); Yoshihisa Abe, Hadano (JP); Kenichi Eriguchi, Hadano (JP)

(73) Assignee: COORSTEK KK, Tokyo (JP)

( * ) Notice: Subject to any disclaimer, the term of this patent is extended or adjusted under 35 U.S.C. 154(b) by 59 days.

(21) Appl. No.: 17/095,195

(22) Filed: Nov. 11, 2020

(65) Prior Publication Data
US 2021/0184004 A1 Jun. 17, 2021

(30) Foreign Application Priority Data

Dec. 17, 2019 (JP) .............................. JP2019-227167
Dec. 24, 2019 (JP) .............................. JP2019-232290

(51) Int. Cl.
*H01L 29/207* (2006.01)
*H01L 29/20* (2006.01)
(Continued)

(52) U.S. Cl.
CPC ........ *H01L 29/207* (2013.01); *H01L 21/0245* (2013.01); *H01L 21/0254* (2013.01);
(Continued)

(58) Field of Classification Search
None
See application file for complete search history.

(56) References Cited

U.S. PATENT DOCUMENTS

2018/0061630 A1 3/2018 Odnoblyudov et al.
2021/0184004 A1* 6/2021 Oishi ................ H01L 21/02502

FOREIGN PATENT DOCUMENTS

JP 2008522447 A 6/2008
JP 2009059945 A 3/2009
(Continued)

OTHER PUBLICATIONS

Office Action dated Aug. 25, 2022, by the Japanese Patent Office in corresponding Japanese Patent Application No. 2019-232290, and an English Translation of the Office Action. (6 pages).
(Continued)

*Primary Examiner* — Jack S Chen
(74) *Attorney, Agent, or Firm* — Buchanan Ingersoll & Rooney PC

(57) ABSTRACT

The present invention provides a nitride semiconductor substrate suitable for a high frequency device. The nitride semiconductor substrate has a substrate, a buffer layer made of group 13 nitride semiconductors, and an active layer made of group 13 nitride semiconductors in this order, wherein the substrate is composed of a first substrate made of polycrystalline aluminum nitride, and a second substrate made of Si single crystal having a specific resistance of 100 Ω·cm or more, formed on the first substrate, the average particle size of AlN constituting the first substrate is 3 to 9 μm, and preferably, the second substrate grown by the MCZ method has an oxygen concentration of 1E+18 to 9E+18 atoms/cm³ and a specific resistance of 100 to 1000 Ω·cm.

1 Claim, 2 Drawing Sheets

(51) Int. Cl.
  H01L 21/02  (2006.01)
  H01L 29/06  (2006.01)
  H01L 29/778  (2006.01)
  H01L 29/267  (2006.01)

(52) U.S. Cl.
  CPC .......... H01L 29/06 (2013.01); H01L 29/2003 (2013.01); H01L 21/0262 (2013.01); H01L 29/267 (2013.01); H01L 29/778 (2013.01)

(56) References Cited

FOREIGN PATENT DOCUMENTS

| JP | 2014103377 A | 6/2014 |
| JP | 2017-059598 A | 3/2017 |
| JP | 2017076687 A | 4/2017 |
| JP | 2019-528576 A | 10/2019 |
| WO | 2017221532 A | 12/2017 |

OTHER PUBLICATIONS

Japanese Office Action dated Jul. 19, 2022, issued in corresponding Japanese Application No. 2019-227167, with English translation (8 pages).

* cited by examiner

Fig. 1
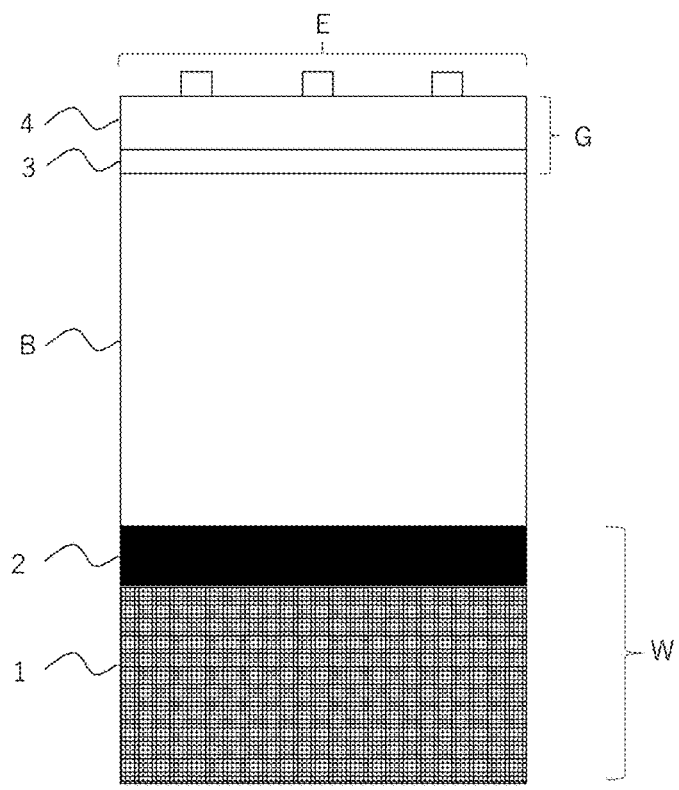
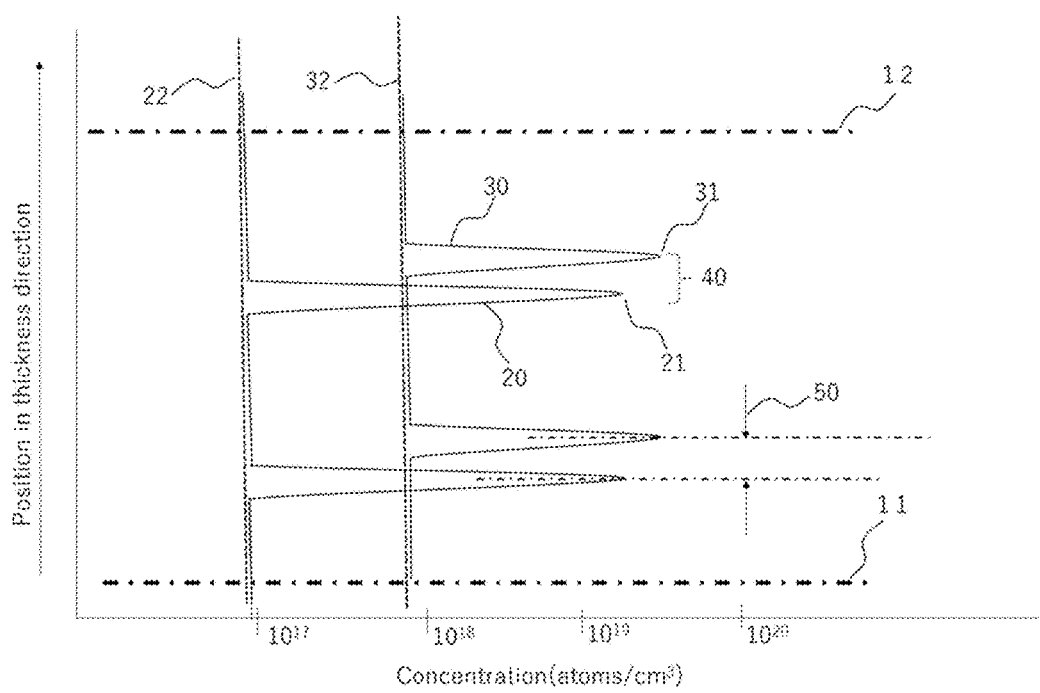
Fig. 2

NITRIDE SEMICONDUCTOR SUBSTRATE AND METHOD OF MANUFACTURING THE SAME

BACKGROUND OF THE INVENTION

Field of Invention

The present invention relates to the nitride semiconductor substrate particularly suitable for a high frequency device.

The present invention relates to the nitride semiconductor substrate having a buffer layer doped with both silicon (Si) elements and carbon (C) elements particularly and its manufacturing method.

Description of the Related Art

A nitride semiconductor substrate composed of nitride semiconductor layers formed on an insulating substrate is used in order to produce a nitride semiconductor device for a high frequency device. For example, Japanese Translation of PCT International Application Publication No. 2008-522447 discloses a semiconductor structure suitable in applications of high frequency leading to low parasitic loss. The semiconductor structure, having a resistivity of more than $10^2 \Omega \cdot cm$, has a silicon substrate with the upper face area having a free carrier concentration of less than $10^{17}/cm^3$ at most, on which material region made of group III nitrides is formed so as to cover the upper face of the silicon substrate.

Recently attention has been focused on a high frequency device using a large-diameter nitride semiconductor substrate with a diameter of 6 inches or more. However, the conventional nitride semiconductor substrates using the silicon (Si) as a ground substrate are not appropriate enough for enlargement of wafer diameter and thickening of the nitride semiconductor layers.

In this regard, for example, Japanese Unexamined Patent Application Publication No. 2017-76687 discloses a compound semiconductor substrate having a compound semiconductor layer formed via a seed layer on a main surface of the ground substrate. The ground substrate is composed of a sintered body. The seed layer is made of a single crystal. The compound semiconductor layer has a buffer layer and an active layer, both of which are crystal-grown on the seed layer in this order. The coefficient of thermal expansion of the sintered body is 0.7 to 1.4 times as great as the average coefficient of thermal expansion of the whole compound semiconductor layer. The full width at half maximum of X-ray diffraction peak of the buffer layer is 800 arcsec or less. This technique is thought to be appropriate enough for enlargement of wafer diameter and thickening of the nitride semiconductor layers.

However, even if the Si single crystal described in Japanese Translation of PCT International Application Publication No. 2008-522447 is applied to the seed layer described in Japanese Unexamined Patent Application Publication No. 2017-76687, this technique is not sufficiently useful to other characteristics except for parasitic capacitance.

A nitride semiconductor high-electron-mobility transistor (HEMT), for example is prepared with a nitride semiconductor substrate having an active layer including gallium nitride (GaN) formed on a substrate made of silicon carbide (SiC) or Si single crystal via a buffer layer made of a variety of nitride semiconductors.

In the buffer layer, various ideas are introduced into the layer structure and the concentration distribution of a dopant for the purpose of reducing warpage and dislocations and improving withstand voltage. One of the ideas is the technique using Si element, which is widely known.

For example, Japanese Unexamined Patent Application Publication No. 2014-103377 discloses the nitride semiconductor device equipped with a deposited stack and a function layer formed on the deposited stack. The deposited stack has an AlGaN layer made of $Al_xGa_{1-x}N$ (0<x≤1), a first Si-containing layer containing SiN and in contact with the upper face of the AlGaN layer, a first GaN layer formed on the first Si-containing layer and having the oblique surface to the upper face of the first Si-containing layer, a second Si-containing layer containing Si, formed on the first GaN layer, and a second GaN layer formed on the second Si-containing layer. The function layer contains nitride semiconductors.

Japanese Unexamined Patent Application Publication No. 2009-59945 discloses a GaN-HEMT 40 having a deposited structure as a first embodiment. The deposited structure is equipped with a non-doped AlN ground layer 42 with a thickness of 0.3 μm, for example, epitaxially formed on a SiC single crystal substrate 41 of plane orientation (0001); a non-doped GaN buffer layer 43 with a thickness of 3 μm, for example, epitaxially formed on the ground layer 42; a n⁺-type GaN band control layer 44 with a thickness of 5 to 50 nm, for example 20 nm, formed on the buffer layer 43 and doped with Si in a concentration of $1 \times 10^{17}$ to $5 \times 10^{18} cm^{-3}$, for example $2 \times 10^{18} cm^{-3}$; a non-doped AlGaN barrier layer 45 with a thickness of 5 to 50 nm and preferably 20 nm, formed on the band control layer 44; a non-doped GaN channel layer 46 with a thickness of 50 nm, for example, epitaxially formed on the barrier layer 45; a non-doped AlGaN spacer layer 47 with a thickness of 5 nm, for example, epitaxially formed on the channel layer 46; an electron supply layer 48 with a thickness of 20 nm, for example, epitaxially formed on the non-doped AlGaN spacer layer 47 and doped with Si in a concentration of $4 \times 10^{18} cm^{-3}$, for example; and a n-type GaN cap layer 49 with a thickness of 7 nm, for example, epitaxially formed on the electron supply layer 48 and doped with Si in a concentration of $5 \times 10^{18} cm^{-3}$, for example. In the channel layer 46, two-dimensional electron gas (2DEG) is formed along an interface with the spacer layer 47 thereon.

The invention of Japanese Unexamined Patent Application Publication No. 2014-103377 enables the introduction of the first Si-containing layer 51s to reduce the density of dislocation 80. Accordingly, it can be said that the first Si-containing layer 51s exerts an effect of shielding the dislocation 80, and that the effect is enhanced by both the first Si-containing layer 51s and the second Si-containing layer 52s.

In the GaN-HEMI 40 described in Japanese Unexamined Patent Application Publication No. 2009-59945, the non-doped AlGaN barrier layer 45 placed under the channel layer 46 has potential barrier which hinders accelerated electrons in the two-dimensional electron gas from getting into the substrate 41. In the first embodiment, since the band control layer 44 under the barrier layer 45 is an n-type layer doped with Si in high concentration, it stays out of electric influence caused by the non-doped GaN buffer layer 43 and the non-doped AlN ground layer 42. In higher power operation of GaN-HEMI 40, even in case accelerated high-energy carriers reached somehow an interface with the GaN buffer layer 43 or the AlN ground layer 42 thereunder, and further, an interface with the SiC substrate so as to be captured, the fluctuations of electrical potential caused by the barrier layer 45 is suppressed, so that the barrier layer 45 forms stable potential barrier.

As above described, various kinds of characteristics of the nitride semiconductor are improved by placing a Si-doped layer in active layers such as a channel layer or the other appropriate layers below the functional layer within a relatively narrower range in the thickness direction.

In recent years, in order to satisfy further demand for high withstand voltage, so-called thickening of a layer has been investigated, for example, growing the nitride semiconductor layer 10 µm or more thick in size. Though it is possible to combine with Si doping technique making reference to Japanese Unexamined Patent Application Publication No. 2014-103377 and Japanese Unexamined Patent Application Publication No. 2009-59945, sufficient effect has not been obtained yet.

SUMMARY OF THE INVENTION

In response to the above issue, an object of the present invention is to provide a nitride semiconductor substrate which is more suitably used as a higher frequency device. The nitride semiconductor substrate features a substrate made of polycrystalline inorganic materials and a seed layer made of Si single crystal formed thereon.

The nitride semiconductor substrate of the present invention has a substrate, a buffer layer made of group 13 nitride semiconductors, and an active layer made of group 13 nitride semiconductors in this order, wherein the substrate is composed of the first substrate made of polycrystalline aluminum nitride, and the second substrate made of Si single crystal having a specific resistance of 100 Ω·cm or more, formed on the first substrate, and the average particle size of AlN constituting the first substrate is 3 to 9 µm.

With this constitution, a nitride semiconductor substrate becomes suitable for making a high frequency device.

The present invention provides a nitride semiconductor substrate having a seed layer made of Si single crystal on polycrystalline inorganic materials, which complies with request for especially both of enlargement of wafer diameter and thickening of the nitride semiconductor layers and is suitable for high frequency device production.

In response to the above issue, an object of the present invention is to provide a nitride semiconductor substrate which can further increase the withstand voltage especially in case of using a buffer layer doped with Si and C.

The nitride semiconductor substrate of the present invention has a substrate, a buffer layer made of group 13 nitride semiconductors on the substrate, and an active layer made of group 13 nitride semiconductors on the buffer layer, wherein the buffer layer has a Si element concentration profile having one peak in the thickness direction of the buffer layer, has a C element concentration profile having one peak in the thickness direction of the buffer layer, and has at least one pair of peaks having a width of 0 to 50 nm between the two peaks.

With this constitution, it becomes possible to produce a nitride semiconductor substrate with high withstand voltage improved due to the buffer layer doped with Si element and C element.

One of the preferable manufacturing processes to embody the present invention comprises a process of forming a buffer layer with a vapor deposition device, wherein the process includes a step of starting a layer formation in a reaction chamber in the vapor deposition device, a step of stopping the layer formation, a step of cleaning the inside of the reaction chamber after stopping, and a step of restarting a layer formation after the cleaning given.

By using the buffer layer appropriately doped with Si element and C element for the purpose of thickening nitride semiconductor layers to increase the withstand voltage, the present invention can provide a nitride semiconductor substrate and the manufacture method which effectively materialize the high withstand voltage.

BRIEF DESCRIPTION OF DRAWINGS

FIG. 1 is a cross-sectional schematic diagram showing the layer structure of nitride semiconductors according to an embodiment of the present invention.

FIG. 2 is a cross-sectional schematic diagram showing the layer structure of the nitride semiconductor substrate according to an embodiment of the present invention.

DESCRIPTION OF THE PREFERRED EMBODIMENTS

Figure 3:
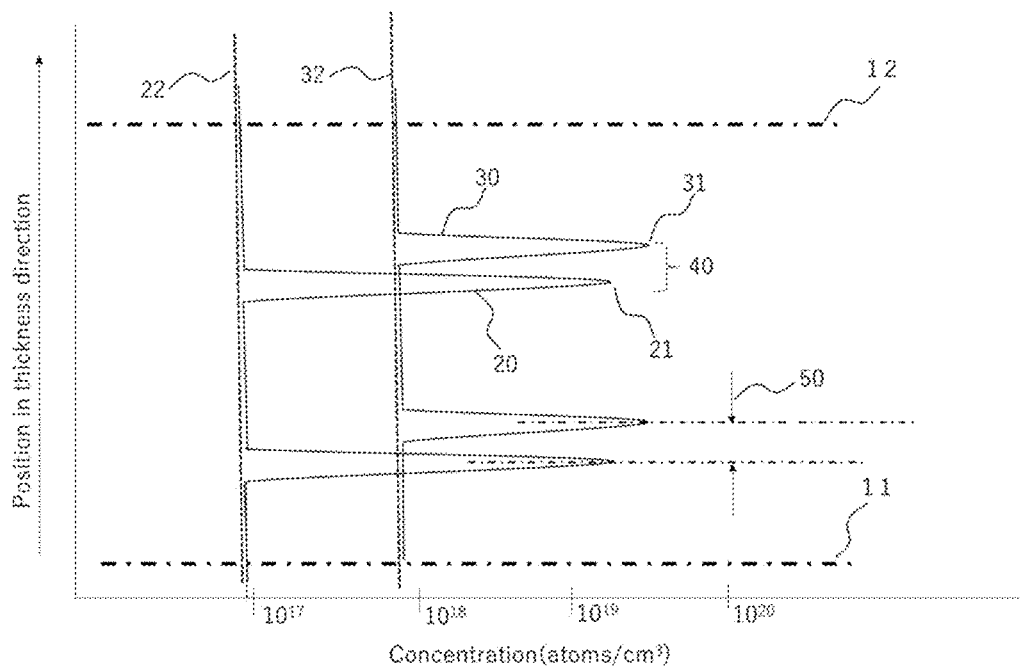
FIG. 3 is a schematic diagram showing Si element concentration profiles and C element concentration profiles in the buffer layer, and peaks and a pair of peaks formed thereby.

Hereinafter, the present invention will be described in detail while making reference to the drawings.

The nitride semiconductor substrate of the present invention has a substrate, a buffer layer made of group 13 nitride semiconductors, and an active layer made of group 13 nitride semiconductors in this order, wherein the substrate is composed of a first substrate made of polycrystalline aluminum nitride, and a second substrate made of Si single crystal having a specific resistance of 100 Ω·cm or more, formed on the first substrate, and the average particle size of AlN constituting the first substrate is 3 to 9 µm.

FIG. 1 is a cross-sectional schematic diagram showing the layer structure of nitride semiconductors according to an embodiment of the present invention. In the schematic diagrams presented in the present invention, shapes are schematically simplified and emphasized for explanation, and the shapes, dimensions and ratios of the details are different from the real ones. A reference sign is omitted for the same configuration as that already shown, and further, any other configurations unnecessary to explain the present invention are not illustrated.

As shown in FIG. 1, the nitride semiconductor substrate Z has a structure in which a buffer layer B and an active layer G are successively deposited on a main surface of a substrate W as a ground plane. In case of using as a semiconductor device, electrodes E are mounted. The substrate W is composed of a first substrate 1 made of polycrystalline aluminum nitride (AlN) and a second substrate 2 made of Si single crystal formed on the first substrate 1.

The basic structure of the nitride semiconductor substrate Z is the same as the compound semiconductor substrate Z described in Japanese Unexamined Patent Application Publication No. 2017-76687, while the present invention is characterized by the unprecedented structure of the substrate W. The details are described later.

The nitride semiconductor of the present invention is made up combining at least one of group 13 elements, such as Ga, Al and indium (In), with nitrogen (N) and, if necessary, may be doped with various elements, such as oxygen (O), Si and magnesium (Mg).

A known structure may be properly applied to the buffer layer B in accordance with the uses and purposes. In view of the application to a high frequency device, the buffer layer B with high resistivity is preferably used in the present invention. Increasing of resistivity is realized by doping the nitride semiconductor layer with C or iron (Fe).

In FIG. 1, as the active layer G, the channel layer 3 and the electron supply layer 4 having a wider band gap than the channel layer 3 are taken up, but not limited thereto. A cap layer, a spacer layer, a p-type layer and so on may be added here. Thicknesses and concentrations of impurities of the foregoing layers can be properly designed depending on the purpose.

In the present invention, as a larger diameter nitride semiconductor substrate suitable for a high frequency device, the total thickness of the buffer layer B and the active layer G is 5 to 20 μm. The substrate made of a single material is difficult to reach levels of the warpage and the dislocation density currently required, even if for example, the 5 μm-thick nitride semiconductor layer is formed on it. However, in the present invention, the buffer layer B can grow more thickly on the substrate W.

Thickening of nitride semiconductor layers is favorable in terms of reduction of parasitic capacitance in a high frequency device. But when the total thickness exceeds 20 μm, the warpage significantly becomes hard to control and its production cost does not correspond to the improvement in performance, in spite of quite satisfactory characteristics such as increased withstand voltage and reduced parasitic capacitance.

The substrate W is composed of a first substrate 1 made of polycrystalline AlN, and on the first substrate, a second substrate 2 made of Si single crystal having a specific resistance of 100 Ω·cm or more.

First, the first substrate 1, made of polycrystalline AlN, has a basic structure similar to that of the compound semiconductor substrate Z described in Japanese Unexamined Patent Application Publication No. 2017-76687. The first substrate 1 may be a single material of AlN, and if necessary, may be a composite where at least one layer composed of Si oxide film, Si nitride film, and films made of various other inorganic materials is formed on the front side and the backside of the substrate made of AlN.

In order to obtain high heat radiation required for the nitride semiconductor substrate effectively, the thermal conductivity of the first substrate 1 should be higher than that of the second substrate 2. AlN is able to give the substrate a thermal conductivity of 100 to 250 W/mK by the optimum materials selection, while Si has a thermal conductivity of a little over 100 W/mK. In order to increase the thermal conductivity of AlN, sufficient sintering is required to remove its grain boundary phases, which results in larger particle in size and strength lowered. Considering balance between heat dissipation and strength, it is preferable that the thermal conductivity of the first substrate 1 should be 150 to 200 W/mK when the second substrate 2 is made of silicon.

In view of the above, the first substrate 1 has an average particle size of 3 to 9 μm. The average particle size is measured by the Chord method.

If the thermal conductivity of the first substrate 1 is set at 150 to 200 W/mK as above described, AlN needs to have a certain level of particle size; however, the particle size should not be excessively enlarged in consideration of the strength. Accordingly, the present invention focuses on balancing the thermal conductivity with the strength, as an indicator to determine the average particle size in the first substrate 1.

When the average particle size is less than 3 μm, the first substrate 1 has difficulty in maintaining a thermal conductivity of 150 to 200 W/mK, because AlN cannot be sufficiently sintered, so that the strength is insufficient and a lot of grain boundary phases remain. In the sintering process through which the average particle size of AlN exceeds 9 μm, the grain boundary phases decrease and sufficient thermal conductivity is obtained, while the process may lower the strength.

Taking account of the above conditions, the average particle size in the first substrate 1 should be 3 to 9 μm and more preferably 4.0 to 7.0 μm. The average particle size is prepared in a timely manner by changing the particle size distribution of powders of source materials, sintering temperatures and types of binders, or by using other known techniques.

The second substrate 2 is a Si single crystal substrate having a specific resistance of 100 Ω·cm or more formed on the first substrate 1. From a viewpoint of suitability for a high frequency device, the second substrate 2 should be highly resistant, considering the technical concept described in Japanese Translation of PCT International Application Publication No. 2008-522447, and should be set to a specific resistance of at least 100 Ω·cm or more.

In the present invention, the second substrate 2 is preferably manufactured by the magnetic field applied Czochralski (MCZ) method. In case of using Si single crystal for the substrate of a high frequency device, the Si single crystal substrate prepared by floating zone (FZ) method, namely FZ wafer will be usually employed for the purpose of achieving of high resistivity. Though the Si single crystal substrate grown by the MCZ method is not so resistant as the one grown by the FZ method, it can be relatively inexpensive. Thus the present invention employs the MCZ wafer as the Si single crystal substrate.

However, in case of using high resistivity silicon for the second substrate 2 for the purpose of lowering the parasitic capacitance, the strength of the second substrate 2 made of high resistivity silicon is at any rate inferior to that of the first substrate 1 made of polycrystalline AlN and both buffer layer B and active layer B made of nitride semiconductors.

When layers stronger than the second substrate 2 are formed on both sides of the second substrate 2 in particular, the stress due to the warpage and distortion generated on the whole nitride semiconductor substrate Z concentrates on the second substrate 2 which is the most inferior in strength. The second substrate 2 composed of the FZ wafer might not withstand the concentration of stress.

Therefore, a preferable embodiment of the present invention is using the second substrate 2 composed of a MCZ wafer having high oxygen concentration and high strength as well as high resistivity, though the MCZ wafer has more difficulty reducing the parasitic capacity than the FZ wafer.

The second substrate 2 composed of the MCZ wafer is inferior in reducing parasitic capacity relatively to that of the FZ wafer. However, it can be compensated with thickening of the buffer layer B. The first substrate 1 made of polycrystalline AlN with an average particle size of 3 to 9 μm, which is used in the present invention, can make the buffer layer B thicker.

It is desirable that the second substrate 2 of the present invention should have an oxygen concentration of 1E+18 to 9E+18 atoms/cm$^3$ and a specific resistance of 100 to 1000 Ω·cm. When the specific resistance of the second substrate 2 is less than 100 Ω·cm, the parasitic capacity is not sufficiently reduced. When the specific resistance is more than 1000 Ω·cm, it may be difficult to hold the strength necessary for the nitride semiconductor substrate Z as a whole, because the oxygen concentration cannot be higher than 1E+18 atoms/cm$^3$. Provided when the oxygen concentration exceeds 9E+18 atoms/cm$^3$, the strength or the hardness is sufficient, to be sure, but the substrate is brittle, which is not considered preferable.

Too much layer thickness causes the strength of the second substrate 2 to reduce as compared with the first substrate 1 and each of the nitride semiconductor layers, which may raise the risk of warpage and peeling of layers at the periphery. Therefore, when the diameter of the substrate W is 6 inch or more, the thickness is preferably 0.1 to 1.0 µm.

The substrate W is prepared by laminating the first substrate 1 and the second substrate 2 together by the use of a known substrate bonding technique. A film of silicon oxide with a thickness of approximately 500 to 1000 nm can be interposed between the first substrate 1 and the second substrate 2.

As above described, the nitride semiconductor substrate Z using the substrate W according to the present invention achieves appropriate thermal conductivity by setting the average particle size of the first substrate 1 at 3 to 9 µm. The average particle size of the first substrate 1 combined with the second substrate 2 as the MCZ wafer ensures the strength of the substrate, and improving the substrate strength can thicken the buffer layer B. Thereby, the nitride semiconductor substrate Z successfully reduces the parasitic capacity. In other words, according to the present invention, using the substrate W for the nitride semiconductor substrate Z provides advantages of appropriate thermal conductivity, strengthening of the substrate, and sufficiently reduced parasitic capacity.

The nitride semiconductor substrate of the present invention has a substrate, a buffer layer made of group 13 nitride semiconductors on the substrate, and an active layer made of group 13 nitride semiconductors on the buffer layer, wherein the buffer layer has a Si element concentration profile having one peak in the thickness direction of the buffer layer, has a C element concentration profile having one peak in the thickness direction of the buffer layer, and has at least one pair of peaks leaving a space of 0 to 50 nm between the two peaks.

FIG. 2 is a cross-sectional schematic diagram showing the layer structure of nitride semiconductors according to an embodiment of the present invention.

The material for the substrate W includes not only Si single crystal but also single crystals, such as SiC, sapphire ($Al_2O_3$) and GaN. Materials for other known techniques, such as the one made of either a single material or different materials are also available. Its plane orientation, dopant concentration and off angle may be set optionally.

However, in the present invention, the preferable substrate W is composed of polycrystalline inorganic materials and a single crystal seed layer formed thereon. Details of this structure are described later.

The buffer layer B made of group 13 nitride semiconductors is formed on the substrate W. The buffer layer B has a stacked structure of plural nitride semiconductor layers, where any known techniques are applied in accordance with the uses and purposes. Nitrides including at least any of Al, Ga and In are suitable for the group 13 nitride semiconductors.

The active layer G made of group 13 nitride semiconductors is formed on the buffer layer B. The active layer G includes a structure having a channel layer and an electron supply layer, as represented by HEMT, but is not limited thereto. The active layer G is appropriately modified as needed.

The buffer layer B includes elements of Si and C. Each of a Si concentration profile and a C concentration profile has at least one peak in the thickness direction within a range from an interface 11 between the substrate W and the buffer layer B to an interface 12 between the buffer layer B and the active layer G.

FIG. 3 is a schematic diagram showing a Si element concentration profile 20, a peak 21 formed from this Si element concentration profile, a C element concentration profile 30, a peak 31 formed from the C element concentration profile, and a pair of peaks 40 composed of the peak 21 and the peak 31 in the buffer layer. In FIG. 3, a vertical axis shows the thickness of the nitride semiconductor substrate towards above from the substrate W and a horizontal axis shows the concentrations of the elements of Si and C, and the diagram gives the Si element concentration profile 20 and the C element concentration profile 30.

The Si element concentration profile 20 has a peak 21 and a base line 22 between an interface 11 and an interface 12. Also with regard to the C element, the C concentration element profile 30 has a peak 31, a base line 32 between an interface 11 and an interface 12. In the present invention, the peak 31 is paired with the peak 21 to make a pair of peaks 40.

In the present invention, the height of each peak and the concentration of each base line are not especially limited, but have preferable ranges as described later. It is desirable that the concentrations of the peaks should be 10 times as much as that of the base line.

Each concentration profile of the elements of Si and C is measured by the secondary ion mass spectrometry (SIMS) in the thickness direction of the nitride semiconductor substrate. In the present invention, peaks are determined by shapes of concentration profiles obtained from SIMS, though other techniques besides SIMS are available as long as the concentration profile is acquired to determine the peaks.

In the present invention, the pair of peaks 40 shows that the peak of Si elements and the peak of C elements are near to each other. Its proximity is fixed at a spacing of 0 to 50 nm between the peaks. Having the pair of peaks 40 contributes to the improvement of withstand voltage.

The peak space 50 can be obtained by measuring a distance between the top of a Si element peak 21 and the top of a C element peak 31, as shown in FIG. 3. An embodiment where the peak space 50 has null distance, being within the scope of the present invention, means that the Si element peak 21 and the C element peak 31 are in the same position in the thickness direction, i.e., are in the same depth from an interface.

When a nitride semiconductor layer made of GaN and so on is doped with C element in high concentration, generally, the withstand voltage is improved, but the generation of dislocations and the deterioration of current collapse become prominent. Therefore, it is not appropriate to increase the C element concentration excessively, which means the C elements exist especially in high concentration throughout the buffer layer.

It is also known as a technique that when the nitride semiconductor layer such as GaN doped with C elements in high concentration is doped with Si elements, defects generated due to the high-concentration carbon elements can be electrically compensated and current collapse exhibited due to a number of such defects can be suppressed.

As above described, high withstand voltage and low current collapse are compatible in the nitride semiconductor substrate layer containing both Si elements and C elements in high concentration. Nevertheless, as has been recently requested, when the nitride semiconductor layer becomes thicker, specifically has a thickness level of not less than 8 µm, it is difficult to achieve a desired level of withstand voltage, even by this technique combined with the effect of thickening layers to improve the withstand voltage.

In the present invention, by giving a considerably high concentration region to the part of the thick nitride semiconductor layer, higher withstand voltage can be obtained while keeping away from problems, such as frequent generation of dislocations, deterioration of current collapse and low crystallinity, generated when Si elements and C elements are spread throughout most of the nitride semiconductor layer in high concentration.

Leakage current flowing through the nitride semiconductor layer is blocked by peak 31 of the C element. Accordingly, in case the amount of C elements is the same in the nitride semiconductor layer, the locally peak-shaped C element concentration profile 30 of the present invention gives higher withstand voltage than the one with a broad peaked shape does.

However, the absolute amount of C elements contained in the peak-shaped profile is a little in the nitride semiconductor layer. Therefore, it is still difficult to obtain the effect of the improved withstand voltage only from such embodiment as the peak-shaped profile shown above.

When the Si element and the C element have concentration peaks and both peaks are near to each other, peak 21 of the Si element interferes with peak 31 of the C element to affect the behavior of leakage current in the nitride semiconductor layer.

When the leakage current flows in the thickness direction of the nitride semiconductor layer, namely the buffer layer B and the action layer G, the withstand voltage decreases. However, the pair of peaks 40 plays a role in which peak 31 of the C elements interferes with electron transfer of the leakage current and peak 21 of the Si elements makes the electron flow smoothly in the interface direction, or vertically to the thickness direction, thereby resulting in the lowering of leakage current.

In other words, when electrons of leakage current are transferred, peak 31 of the C elements acts as a "barrier" in the thickness direction by which the electron transfer in the thickness direction is suppressed to some degree; peak 21 of the Si elements diffuses electrons moving towards the thickness direction into a direction vertical to the thickness direction, which thereby suppress leakage current in the thickness direction as a whole. When the peak space 50 is more than 50 nm apart, such effect is not sufficiently exerted, which is unfavorable.

As above described, the pair of peaks 40 of the present invention can effectively reduce leakage current in the thickness direction while reducing total concentration amounts of the Si elements and the C elements contained in all the buffer layer B and the active layer G.

A more preferable embodiment of the present invention will be below described.

It is preferable that the concentration of Si elements should be 6E+18 to 1E+21 atoms/cm³ inclusive at the top of the peak 21 and 1E+17 atoms/cm³ or less at the base line 22.

At least 6E+18 atoms/cm³ or more is needed to enhance the withstand voltage; however the concentration of more than 1E+21 atoms/cm³ may bring about deterioration of the crystal quality. When the Si concentration at the base line is set at 1E+17 atoms/cm³ or less and the difference in the concentrations of Si elements between the base line 22 and the peak 21 becomes greater, the withstand voltage is more improved.

The width of peak 21 in the concentration profile 20 of Si elements measured by a half-width method is preferably 5 to 20 nm. The present invention is characterized in that the concentration profile of Si elements forms a region with steep inclination, or a peak. The peak 21 contributes more to improvement of the withstand voltage in the thickness direction, when being positioned within a very narrow region.

When the width of peak 21 obtained in the half-width method is less than 5 nm, the effect of interfering with the peak 31 of C elements is insufficient. On the other hand, when the width of peak 21 obtained in the half-width method is more than 20 nm, the peak becomes a typical broad shape, and the peak effect, as above described, is difficult to be obtained.

It is preferable that the concentration of C elements should be 5E+18 to 8E+20 atoms/cm³ inclusive at the top of the peak 31 and 1E+18 atoms/cm³ or less at the base line 32.

At least 5E+18 atoms/cm³ or more is needed to enhance the withstand voltage; however the concentration of more than 8E+20 atoms/cm³ may bring about deterioration of the crystal quality. When the C concentration at the base line 32 is set at 1E+18 atoms/cm³ or less, the influence due to too large amount of C elements can be suppressed.

It is preferable that the width of peak 31 in the C element concentration profile 30 obtained in the half-width method should be 5 to 20 nm. When the width of peak 31 obtained in the half-width method is less than 5 nm, the so-called "barrier" is too thin to shield the electrons sufficiently even if the buffer layer B has an increased resistivity due to the high carbon concentration. On the other hand, when the width of peak 31 obtained in the half-width method is more than 20 nm, the peak forms a broad hill-like shape and hardly works as a "barrier".

In the present invention, it is more desirable that any of the distance from an interface 11 between the substrate W and the buffer layer B to the nearest peak top, the distance from an interface 12 between the buffer layer B and the active layer G to the nearest peak top, and the distance between the peak tops of neighboring pairs of peaks in case there exist multiple pairs of peaks should be 3 µm or more.

As described in Japanese Unexamined Patent Application Publication No. 2014-103377, when multiple peaks exist in close proximity to each other, those peaks form a wide and broad shape as a whole. In such a form, there is still disadvantage due to the high concentration of C and Si elements as previously described, which may be an obstacle to exert the effect of the present invention sufficiently.

The pair of peaks 40 of the present invention is also a unique layer because of containing Si elements and C elements locally as dopant in high concentration, so that the interface 11 and the interface 12 should not be too close to each other, taking the distortion generated in other layers and influence of electric characteristics into consideration. The interface 11 is preferably distant from the interface 12 by 3 µm or more.

However, when either the interface 11 or the interface 12 is too distant from the pair of peaks 40, the effect of the present invention can be no longer improved. Besides, there arises concern about cost caused by insertion of a unique layer and deterioration of the crystal quality. Accordingly, in the present invention, the distance between the pair of peaks 40 and either the interface 11 or the interface 12 is preferably 5 μm or less.

In the more preferable embodiment of the present invention, the number of the pair of peaks 40 is two or more, a total thickness of the buffer layer B and the active layer G is 10 to 20 μm, and the substrate W is composed of polycrystalline inorganic materials having a single crystal seed layer formed thereon.

As above described, as the pair of peaks 40 of the present invention should not be positioned too distant from each interface. When the buffer layer B is thickened, it is desirable that two or more pairs of peaks 40 should be formed in terms of maintaining enhanced withstand voltage.

Also herein, when the other neighboring pair of peaks 40 is too distant from one pair of peaks 40, it is not preferable for the reasons described above. Accordingly, the distance from one pair of peaks 40 to the other neighboring pair of peaks 40, that is to say, the distance between the peak tops of peaks 21 and 31, should be set to be 5 μm or less.

Even in the present invention, however, when the buffer layer B is too thick, it may be difficult to control the warpage of the whole nitride semiconductor substrate.

In the present invention, the whole thickness of the buffer layer B is 10 to 20 μm inclusive, and preferably 11 to 15 μm inclusive. When the thickness of the buffer layer B is more than 10 μm, the substrate W made of a single material can be no longer controlled for its warpage or dislocation. Under such circumstances, it is difficult to make the nitride semiconductor substrate high performance, granted that the present invention is applied as it is. Thus, in case where a total thickness of the buffer layer B and the active layer G is 10 to 20 μm, the present invention employs the substrate W composed of polycrystalline inorganic materials having a single crystal seed layer formed thereon, thereby coping with the thickening of the layer.

The present invention enables the nitride semiconductor substrate to work more efficiently when its buffer layer B has a thickness of 10 μm or more; that is, the more preferable structure of the substrate W is that the substrate W is made of AlN ceramics for the first substrate 1 on which Si single crystal is deposited for the second substrate 2.

An example of the substrate W composed of polycrystalline inorganic materials having a single crystal seed layer formed thereon is the invention described in Japanese Unexamined Patent Application Publication No. 2017-76687. To put it concretely, the polycrystalline inorganic materials correspond to ceramic substrate mainly made of AlN, and the single crystal seed layer is made of Si single crystal.

Accordingly, in an embodiment where the number of pair of peaks 40 is two or more, a total thickness of the buffer layer B and the active layer G is 10 to 20 μm, and the substrate W is composed of polycrystalline inorganic materials (e.g., AlN ceramics) and a single crystal seed layer (e.g., Si single crystal) formed thereon, the present invention synergistically exerts the effect of enhancing withstand voltage due to thickening of the buffer layer B and the effect of enhancing withstand voltage due to the pair of peaks 40.

Though it is conventionally known that when the buffer layer B is just thickened to 10 μm or more, or more notably 15 μm or more, it causes big warpage and dislocations, the present invention makes it possible to suppress the warpage and to enhance the withstand voltage without increasing the layer thickness excessively.

A preferable manufacturing method to carry out the present invention includes a process of forming a buffer layer using a vapor deposition device, wherein the process includes a step of starting a layer formation in a reaction chamber in the vapor deposition device, a step of stopping the layer formation, a step of cleaning the inside of the reaction chamber after stopping, and a step of restarting a layer formation after the cleaning given.

The nitride semiconductor substrate is preferably manufactured using a metalorganic chemical vapor deposition (MOCVD) device. The MOCVD device is also used in the present invention, though other vapor deposition methods, such as hydride vapor phase epitaxy (HVPE) are available.

As nitride semiconductor layers grow using the MOCVD device, they are also piled up inside the reactor. It has recently become clear that the piled deposits make some impact on the nitride semiconductor layers formed subsequently on the substrate.

On this matter, the present inventors have found one of the processes for manufacturing a nitride semiconductor substrate of the present invention; the process includes steps of cleaning the MOCVD device to remove a film of nitride semiconductors deposited accumulatively inside the reactor, and then forming fresh new layers of nitride semiconductors on the nitride semiconductor layers partly formed on the substrate.

The above steps function to segregate source gases, Si elements from Si single crystal used as the substrate, and C elements on the surface of the nitride semiconductor layers which are to restart deposition, thereby generating the pair of peaks 40 used in the present invention. The pair of peaks 40 of Si elements and C elements can be easily formed inside the surface with uniform narrow width quite desirably.

A known method applied to clean the MOCVD device is used for the above-described cleaning. One example is dry cleaning. Treatment temperature, treatment time, and the kinds of gas used are not particularly determined, as long as deposits inside the reactor are roughly removed.

As above described, in thickening the nitride semiconductor layer for the purpose of enhancing the withstand voltage, the nitride semiconductor substrate of the present invention not only makes the layer thicker, but also achieves higher withstand voltage while sufficiently ensuring warpage, dislocation and other characteristics. It is especially unlike any other nitride semiconductor substrates in that the level of withstand voltage reached by setting the layer thickness at 20 μm or more can be attained with only a small thickness.

EXAMPLES

Hereinafter, the present invention will be described in detail with reference to examples, but the present invention is not restricted to the examples.

[Preparation of the First Substrate 1]

A 6 inch diameter and 1000 μm thick substrate made of AlN sintered body was prepared as the first substrate 1. A main surface of this ground substrate was polished to mirror finish by a known mirror polishing method so that the arithmetic mean roughness (Ra) could be 100 nm or less. The average particle size of AlN in the mirror surface was 5 μm.

[Preparation of the Second Substrate 1]

A 6 inch diameter and 675 μm thick MCZ wafer of (111) plane orientation having a specific resistance of 500 Ω·cm and an oxygen concentration of 3E+18 atoms/cm$^3$ was prepared. One side of the wafer was polished to mirror finish so that the arithmetic mean roughness (Ra) could be 50 nm. Then, the substrate was placed in a heat treatment furnace for a semiconductor to oxidize for 2 hours at 1000° C. in a 100% oxygen atmosphere, and then to form an oxide film on the mirror finished surface.

[Preparation of the Substrate W: Joining and Polishing of the First Substrate 1 and the Second Substrate 2]

The mirror finished surface of the first substrate 1 and that of the second substrate 2, prepared as above, were bonded by a known thermo-compression method. The surface of the second substrate 2 was grinded so as to have a thickness of 0.5 μm, and finally was polished to mirror finish so that the arithmetic mean roughness (Ra) could be 50 nm. As above described, the substrate W was prepared.

[Conditions Preparing the Buffer Layer B]

Next, by vapor deposition using trimethylaluminum (TMAl), trimethylgallium (TMGa) and ammonia ($NH_3$) as source materials, an initial layer composed of a 100 nm-thick AlN layer and a 150 nm-thick $Al_{0.2}Ga_{0.8}N$ layer thereon was grown and, on the initial layer, a multilayer was grown by repeating alternate deposition of a 5 nm-thick AlN layer and a 30 nm-thick $Al_{0.2}Ga_{0.8}N$ layer twenty times, and subsequently a single layer composed of a 7300 nm-thick GaN layer was grown on the multilayer. Thus formed structure including the initial layer, the multilayer and the single layer in this order was used as the buffer layer B. The thickness of the buffer layer B was 8000 nm.

[Conditions Preparing the Active Layer G]

Then, a 100 nm-thick GaN layer as the channel layer 3 and a 20 nm-thick $Al_{0.22}Ga_{0.78}N$ layer as the electron supply layer 4 were deposited in this order, to form the active layer G. The buffer layer B and the active layer G were formed by setting the growth temperature and pressure at 1050° C. and 60 hPa, respectively, as approximate references, and appropriately adjusting them for each of the layers. As above described, a nitride semiconductor substrate Z of Experiment Example 1 was prepared.

Nitride semiconductor substrates Z of Experiment Examples 2 to 10 were prepared in a manner similar to Experiment Example 1, except that average particle sizes of the first substrate 1 and oxygen concentrations and specific resistances of the second substrate 2 were changed as shown in Table 1.

Reference Example

A nitride semiconductor substrate of Reference Example was prepared in a manner similar to Experiment Example 1 except that the first substrate 1 was not used, the second substrate 2 was changed to a 4 inch diameter and 525 μm thick Si single crystal substrate grown by the FZ method of (111) plane orientation having a specific resistance of 2000 Ω·cm and an oxygen concentration of 1E+17 atoms/$cm^3$, and that the thickness of the GaN layer in the buffer layer B was 500 nm. This substrate was used as a benchmark of the parasitic capacitance.

[Evaluation 1: High Frequency Characteristics]

A pair of aluminum electrodes were formed on sample surfaces of Experiment Examples 1 to 10 and Reference Example. By measuring reflection coefficient between the electrodes, with vector network analyzer, the reactance component of impedance transformed therefrom was evaluated as the parasitic capacitance. The reflection coefficient was measured at a frequency of 5 GHz. Each sample was compared using the relative value normalized by the measured value in Experiment Example 1.

[Evaluation 2: Strength of the Substrate]

The strength of substrate was estimated for warpage of the nitride semiconductor substrate Z. To put it concretely, the warpage of the whole substrate (BOW value) was measured and compared with a known warpage measuring device for semiconductor wafer. A BOW value of a range of −70 to +50 μm inclusive was determined to be passed or "good", and the ones outside the range to be failed or "poor".

[Evaluation 3: Thermal Conductivity]

The thermal conductivity in the thickness direction of the samples was measured by a laser flash method and was compared for each of the nitride semiconductor substrates Z of Experiment Examples 1 to 10 and Reference Example. The laser flash method measures the thermal diffusivity, and multiplying it by the specific heat and the density of the sample yields the thermal conductivity; because of the complicated structures of the samples, it is difficult to estimate the thermal conductivity accurately. In this experiment, the measured value of thermal diffusion coefficient obtained from a certain hypothetical parameter was used as an index showing the difference of the thermal conductivity between the samples on the basis of their common shape parameters. Each sample was compared using the relative value normalized by the measured value in Experiment Example 1 in the same way as the parasitic capacitance.

Several Experiment Examples, in which the first substrates 1 have different average particle sizes and the second substrates 2 have different oxygen concentrations or specific resistances, were prepared as shown in Table 1. They were prepared in a manner similar to Experiment Example 1 except for the changed parameters.

Table 1 summarizes conditions and evaluation results of Reference Example and each Experiment Example.

TABLE 1

| | Avg. Particle Size (μm) in the first substrate 1 | Oxygen Concentration (atoms/$cm^3$) of the second substrate 2 | Specific Resistance (Ω · cm) of the second substrate 2 | Parasitic Capacitance (value relative to that of Exp. Ex. 1) | Warpage | Thermal Conductivity (value relative to that of Exp. Ex. 1) | Judgment |
|---|---|---|---|---|---|---|---|
| Ref. Ex. | 5 | 1E+17 | — | 1.4 | — | — | — |
| Exp. Ex. 1 | 5 | 3E+18 | 500 | 1 | Good | 1 | Passed |
| Exp. Ex. 2 | 3 | 3E+18 | 500 | 1 | Good | 0.7 | Passed |
| Exp. Ex. 3 | 9 | 3E+18 | 500 | 1 | Good | 2 | Passed |
| Exp. Ex. 4 | 5 | 1E+18 | 500 | 1 | Good | 1 | Passed |
| Exp. Ex. 5 | 5 | 9E+18 | 500 | 1 | Good | 1 | Passed |
| Exp. Ex. 6 | 5 | 8E+17 | 500 | 1 | Good | 1 | Passed |
| Exp. Ex. 7 | 5 | 1E+19 | 500 | 1 | Good | 1 | Passed |
| Exp. Ex. 8 | 5 | 3E+18 | 50 | 1.6 | Good | 1 | Failed |
| Exp. Ex. 9 | 2 | 3E+18 | 500 | 1 | Good | 0.3 | Failed |
| Exp. Ex. 10 | 10 | 3E+18 | 500 | 1 | Poor | 2.5 | Failed |

As is clear from results of Table 1, Experiment Examples 1 to 7 within the scope of the present invention show good warpage and thermal conductivity, and also show parasitic capacitance superior to that of Reference Example using the FZ wafer. On the other hand, in Experiment Examples 8 to 10 which are outside the scope of the present invention, any of parasitic capacitance, warpage and thermal conductivity is inferior to those of Experiment Examples 1 to 7. Especially in Experiment Example 10, cracks were seen to generate on the substrate.

Hereinafter, the present invention will be described in detail with reference to examples, but the present invention is not restricted to the examples.

Example 1

The nitride semiconductor substrate was prepared in accordance with the method of preparing sample 1 described in Japanese Unexamined Patent Application Publication No. 2017-76687.
[Formation of Substrate W]
(Preparation of the Ground Substrate)
A 6 inch diameter and 1000 μm thick substrate made of AlN sintered body was prepared as the ground substrate. Both sides of the ground substrate were polished to mirror finish so that the arithmetic mean roughness (Ra) could be 50 nm or less.
(Preparation for Production of the Seed Layer)
A 6 inch diameter and 675 μm thick Si singe crystal substrate of (111) plane orientation having a specific resistance of 0.002 Ω·cm was prepared. One side of the substrate was polished to mirror finish so that the arithmetic mean roughness (Ra) could be 50 nm or less. Then, the substrate was oxidized at 1000° C. for 2 hours in a 100% oxygen atmosphere with a heat treatment furnace for a semiconductor to be a base of the seed layer.
(Joining and Processing of the Ground Substrate and the Base of the Seed Layer)
The mirror finished surface of the ground substrate and that of the base of the seed layer, as prepared above, were bonded by a known thermo-compression method. The surface of the base of the seed layer was grinded so as to have a thickness of 0.5 μm, and finally was polished to mirror finish so that the arithmetic mean roughness (Ra) might be 50 nm or less. Thus, a joint body composed of the ground substrate and the resultant seed layer was obtained.
[Formation of the Nitride Semiconductor Layer]
(Formation of the Initial Layer)
The joint body described above was cleaned up by a known substrate cleaning method, and was placed in a MOCVD device. After substituting the inside of the device with a gas, the temperature was raised, and the joint body was kept at 1000° C. for 15 minutes in a 100% hydrogen atmosphere. Next, a 150 nm-thick first initial layer made of AlN single crystal was grown at 1000° C. by vapor deposition using trimethylaluminum (TMA) and ammonia (NH$_3$) as source gases. All the Ga-based nitride semiconductors were formed by setting the growth temperature at 1000° C. as a reference and adjusting it slightly within a range of 1 to 15° C. A 250 nm-thick second initial layer made of Al$_{0.1}$Ga$_{0.9}$N single crystal was grown on the initial layer, using trimethylgallium (TMG), TMA and NH$_3$ as source gases.
(Formation of the Buffer Layer B)
Next, the first deposition of the buffer layer B was carried out. A multilayer was grown by repeating alternate deposition of a 5 nm-thick AlN layer and a 22 nm-thick Al$_{0.2}$Ga$_{0.8}$N layer twenty times, and on the multilayer, a 3000 nm-thick Al$_{0.2}$Ga$_{0.8}$N layer was grown. The growth temperature was 1000° C.

The nitride semiconductor substrate was taken out of the MOCVD device and kept in a clean atmosphere for a while. The empty inside of the MOCVD device was dry-cleaned without placing the substrate. This treatment is a known method using a chlorine reactant gas.

After dry cleaning treatment was completed, the substrate was placed in the MOCVD device again, and the second deposition of the buffer layer B was carried out. A 250 nm-thick Al$_{0.2}$Ga$_{0.8}$N layer, a 3250 nm-thick Al$_{0.15}$Ga$_{0.85}$N layer, and a 4500 nm-thick GaN layer were deposited in this order.

Finally, a 100 nm-thick GaN layer as the channel layer and a 20 nm-thick Al$_{0.22}$Ga$_{0.78}$N layer as the electron supply layer were deposited in this order, to form the active layer G. The nitride semiconductor substrate was used as an evaluation sample of Example 1.

Comparative Example 1

The nitride semiconductor substrate was prepared in a manner similar to Example 1, except that the buffer layers B were deposited consecutively without any dry cleaning treatment. The nitride semiconductor substrate was used as an evaluation sample of Comparative Example 1.
[Evaluation 1: Warpage]
The BOW values of each evaluation sample were measured using a multipurpose warpage measuring device commonly used as a shape measuring device for semiconductor substrate. A BOW value of a range of −50 to +20 μm inclusive was determined to be passed or "good".
[Evaluation 2: Withstand Voltage]
A strip-shaped test piece with a width of 20 mm was cut out from the center part to the edge part of the substrate main surface of each evaluation sample. Next, the electron supply layer and the channel layer of the test piece were partly removed by dry etching. Under this circumstance, a 10 mm$^2$-sized Au electrode was vacuum deposited on the surface exposed by the dry etching to form a Schottky electrode. To compare the current values at 600V, by conducting electricity on the Si single crystal substrate side, using a commercially available curve tracer, I-V characteristic was measured. 1×10$^{-8}$ A or less was determined to be passed or "A".

As a result, the warpage was −20 μm in Example 1 and −50 μm in Comparative Example 1. Though Example 1 shows a better result, both warpages can be recognized to be passed. On the other hand, a withstand voltage of 0.8×10$^{-8}$ A in Example 1 was passed, but that of 2.1×10$^{-8}$ A in Comparative Example 1 was failed.

With regard to the nitride semiconductor substrate in Example 1, crystallinity of the nitride semiconductor layer formed immediately above the pair of peaks 40 (evaluated from the full width at half maximum) was better than that of the corresponding portion prepared without forming any of peak 21 and peak 31, that is to say, without stopping the process for the cleaning. This is because the influence of residue in the MOCVD device was removed by dry cleaning.

What is claimed is:
1. A nitride semiconductor substrate having a substrate, a buffer layer made of group 13 nitride semiconductors on the substrate, and an active layer made of group 13 nitride semiconductors on the buffer layer, wherein the buffer layer has a silicon element concentration profile having one peak in the thickness direction of the buffer layer, has a carbon element concentration profile having one peak in the thickness direction of the buffer layer, and has at least one pair of peaks having a width of 0 to 50 nm between the two peaks.

* * * * *